US005430618A

United States Patent [19]
Huang

[11] Patent Number: 5,430,618

[45] Date of Patent: Jul. 4, 1995

[54] ADAPTOR WITH ELECTROMAGNETIC SHIELDING CAPABILITIES

[76] Inventor: George Y. Huang, 5F, No.277-1, Sec.4, Pa-Te Rd., Taipei City, Taiwan

[21] Appl. No.: 228,938

[22] Filed: Apr. 18, 1994

[51] Int. Cl.[6] .............................................. H05K 9/00

[52] U.S. Cl. .................................... 361/818; 361/752; 361/800; 361/807; 361/816; 174/35 R; 174/35 TS; 439/47

[58] Field of Search ............... 361/748, 752, 758, 759, 361/785, 796, 800, 801, 802, 807, 816–818; 174/17 R, 35 R, 35 GC, 35 TS, 35 C; 439/78, 79, 47

[56] References Cited

U.S. PATENT DOCUMENTS 5,128,835 7/1992 Rudy, Jr. et al. .................... 361/424

5,206,796 4/1993 Thompson et al. .................. 361/424

*Primary Examiner*—Leo P. Picard
*Assistant Examiner*—Young Whang
*Attorney, Agent, or Firm*—Kirschstein et al.

[57] ABSTRACT

An adaptor includes an adaptor casing, a circuit board and a cover piece. The adaptor casing includes lower and upper casing halves which are made of plastic and which are coated entirely with a layer of conductive material. A circuit board is disposed in the adaptor casing and has a top surface provided with a switch unit that is aligned with an opening formed in the upper casing half and that extends out of the adaptor casing via the opening, a first edge provided with a first connector, and an opposite second edge provided with a second connector. Each of the first and second connectors has a support plate which closes a respective one of front and rear open ends of the adaptor casing. The support plates and the adaptor casing cooperatively form an enclosure for confining the circuit board therein. The cover piece is made of plastic and is coated entirely with a layer of conductive material. The cover piece is fitted detachably in the opening of the upper casing half.

5 Claims, 3 Drawing Sheets

ADAPTOR WITH ELECTROMAGNETIC SHIELDING CAPABILITIES

BACKGROUND OF THE INVENTION

1. Field of the Invention

The invention relates to an adaptor, more particularly to an adaptor with electromagnetic shielding capabilities.

2. Description of the Related Art

The need to minimize the effects of electromagnetic interference grows in importance as the complexity and precision of electronic equipments increase. Since it is not uncommon to transmit and amplify weak signals in multiple stages, interference in the original signals may exceed tolerable levels during the final stage. Presently, several filter and amplifier stages are employed to minimize the effects of signal interference during signal transmission. Such a solution increases the costs incurred and does not necessarily provide ideal results.

Referring to FIG. 1, a conventional adaptor is shown to comprise a circuit board 10, a DIP switch unit 101 provided on the circuit board 10, and an adaptor casing which includes lower and upper casing halves 11, 12 that are made of plastic. The upper casing half 12 is formed with an opening 121 that is aligned with the switch unit 101, thereby enabling the latter to extend out of the adaptor casing to facilitate operation thereof. The lower and upper casing halves 11, 12 are joined together so as to enclose the circuit board 10 therein.

As the requirement for purity of signals becomes more stringent, the density and complexity of the adaptor circuit similarly increase. The presence of the switch unit 101 enables the adaptor to operate in different signal conversion modes. However, due to the complexity of the adaptor circuit, which results in a longer transit time for signals, and the presence of multiple contacts at the switch unit 101, signal interference is likely to occur since the plastic adaptor casing only serves to protect the circuit board 10 and does not serve to minimize the presence of electromagnetic interference.

SUMMARY OF THE INVENTION

Therefore, the objective of the present invention is to provide an adaptor with adaptor casing which is capable of electromagnetic shielding.

Accordingly, the adaptor of the present invention comprises an adaptor casing, a circuit board and a cover piece. The adaptor casing includes lower and upper casing halves which are made of plastic and which are coated entirely with a layer of conductive material. The lower casing half has a bottom wall with two opposite sides provided respectively with at least one side wall. The upper casing half has a top wall with an opening formed therethrough and two opposite sides provided respectively with at least one side wall that engages a corresponding one of the side walls provided on the bottom wall, thus forming the adaptor casing with front and rear open ends. A circuit board is disposed in the adaptor casing and has a top surface provided with a switch unit that is aligned with the opening and that extends out of the adaptor casing via the opening, a first edge provided with a first connector, and an opposite second edge provided with a second connector. Each of the first and second connectors has a support plate which closes a respective one of the front and rear open ends of the adaptor casing. The support plates and the adaptor casing cooperatively form an enclosure for confining the circuit board therein. The cover piece is made of plastic and is coated entirely with a layer of conductive material. The cover piece is fitted detachably in the opening of the upper casing half. The adaptor of the present invention has electromagnetic shielding capabilities since the adaptor casing and the cover piece are coated with a respective layer of conductive material.

BRIEF DESCRIPTION OF THE DRAWINGS

Other features and advantages of the present invention will become apparent in the following detailed description of the preferred embodiments, with reference to the accompanying drawings, of which.

DETAILED DESCRIPTION OF THE PREFERRED EMBODIMENTS

Figure 1:
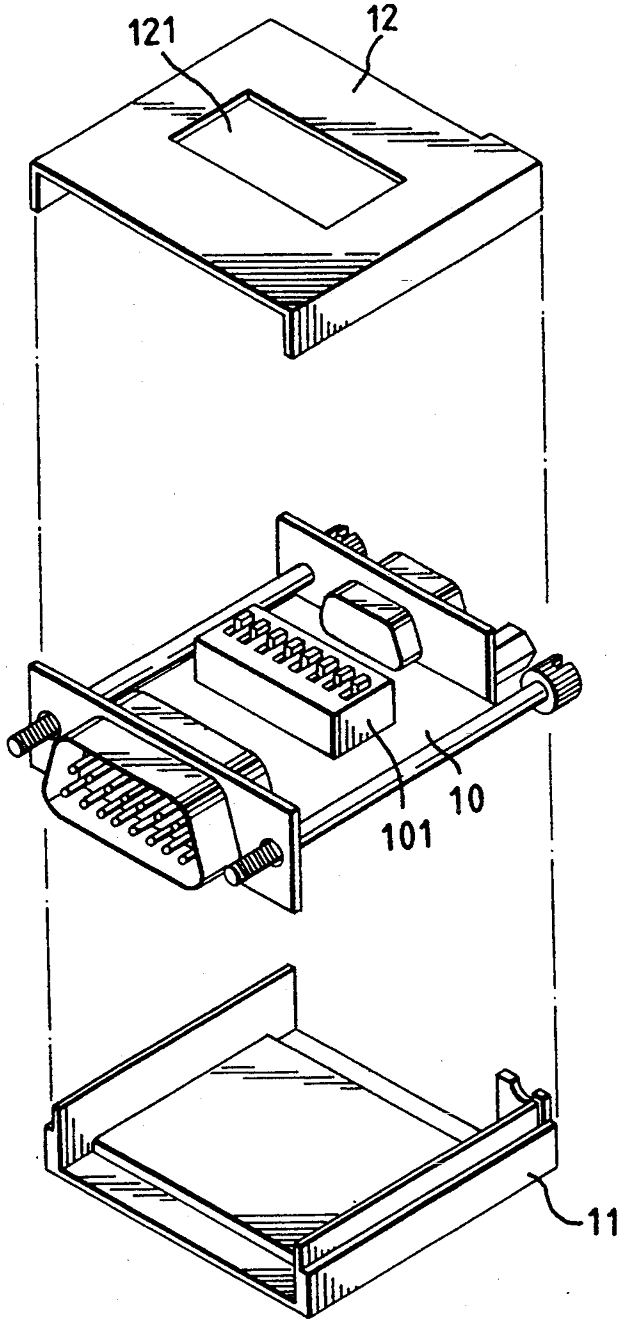
FIG. 1 PRIOR ART
FIG. 1 is an exploded view of a conventional adaptor.
Figure 2:
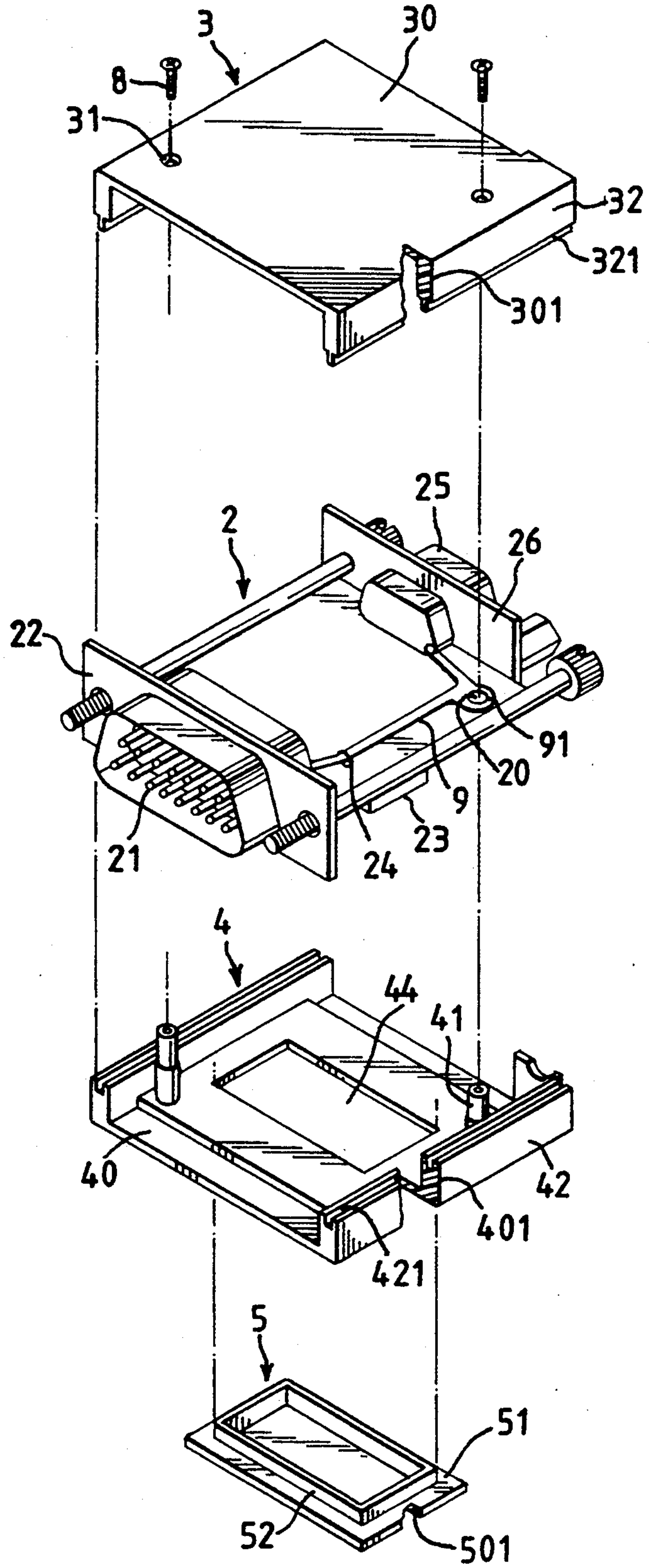
FIG. 2 is an exploded, partly sectional, inverted perspective view of the first preferred embodiment of an adaptor according to the present invention.

Referring to FIG. 2, the first preferred embodiment of an adaptor according to the present invention is shown to comprise a circuit board 2, an adaptor casing including lower and upper casing halves 3, 4, and a cover piece 5.

A first connector 21, such as a 15-pin D-sub connector, is mounted on a first edge of the circuit board 2 and is provided with a grounded support plate 22. A second connector 25, such as a 15-pin high-density D-sub connector, is mounted on an opposite second edge of the circuit board 2 and is similarly provided with a grounded support plate 26. A conductor 9 has two ends connected respectively to the support plates 22, 26 and is connected electrically to a ground point 24 on the bottom surface of the circuit board 2. The conductor 9 has an intermediate portion which is formed with a connecting ring 91. The connecting ring 91 defines a hole which is aligned with one of two fastener holes 20 (only one is shown) formed in the circuit board 2. A DIP switch unit 23 is provided on the top surface of the circuit board 2 and serves as a function select switch to enable the adaptor to perform selectively different functions.

The lower casing half 3 is made of a lightweight plastic material that is coated entirely with a layer 301 of conductive material. Preferably, the layer 301 of conductive material has a low resistivity to increase the electromagnetic shielding capability of the lower casing half 3. The lower casing half 3 has a bottom wall 30 which is formed with a pair of screw holes 31 that are aligned with the fastener holes 20, and a pair of side walls 32 which project from opposite sides of the bottom wall 30. Each of the side walls 32 has a distal end surface that is formed with a longitudinally extending projection 321.

The upper casing half 4 is made of a lightweight plastic material that is coated entirely with a layer 401 of conductive material. Preferably, the layer 401 of conductive material has a low resistivity to enhance the electromagnetic shielding capability of the upper casing half 4. The upper casing half 4 has a top wall 40 which is formed with a pair of tubular internally threaded sockets 41 and a pair of side walls 42 which project from opposite sides of the top wall 40. The threaded sockets 41 extend toward the lower casing half 3 and are aligned with and extend through the fastener holes 20, The interior of the sockets 41 are also coated with the layer 401 of conductive material. Each of the side walls 42 has a distal end surface that is formed with a longitudinally extending groove 421 to receive the projection 321 of a corresponding one of the side walls 32 therein. The top wall 40 is further formed with an opening 44 that is aligned with the switch unit 23, thereby enabling the latter to extend out of the adaptor casing to facilitate operation thereof.

The cover piece 5 is made of a plastic material that is coated entirely with a layer 501 of conductive material. The cover piece 5 includes a plate portion 51 which has an area that is larger than that of the opening 44, and a loop projection 52 which projects from the plate portion 51 and which conforms with the shape of the opening 44 so as to extend fittingly and detachably therein.

When the circuit board 2 is disposed in the adaptor casing, the threaded sockets 41 extend through the fastener holes 20 in the circuit board 2, thereby clamping the connecting ring 91 of the conductor 9 between a distal end of one of the threaded sockets 41 and the bottom wall 30 of the lower casing half 3. Conductive screws 8 engage threadedly the screw holes 31 in the lower casing half 3 and the threaded sockets 41 of the upper casing half 4 so as to join the lower and upper casing halves 3, 4. The support plates 22, 26 of the first and second connectors 21, 25 close respectively front and rear open ends of the adaptor casing. Preferably, the diameter of the hole defined by the connecting ring 91 is slightly smaller than the diameter of the conductive screws 8 to permit tight contact between the connecting ring 91 and one of the screws 8 so as to establish electrical connection therebetween. The threaded engagement among the screws 8 and the lower and upper casing halves 3, 4 also establishes electrical connection thereamong. Therefore, aside from interconnecting the support plates 22, 26, the conductor 9 also serves as a path for connecting electrically the lower and upper casing halves 3, 4 to the ground point 24 on the circuit board 2. Electrical connection between the cover piece 5 and the upper casing half 4 is also achieved when the former is mounted on the latter. Thus, the cover piece 5, the upper and lower casing halves 4, 3, and the support plates 22, 26 not only cooperate to form an enclosure to protect the circuit board 2, but also serve as an electromagnetic shield of the adaptor of the present invention.

When the lower and upper casing halves 3, 4 are joined together, the projections 321 on the lower casing half 3 are received in the grooves 421 in the upper casing half 4. The projections 321 and the grooves 421 not only serve to improve the structural connection between the lower and upper casing halves 3, 4, but also serve to increase the area of the connecting surface therebetween to achieve better electromagnetic shielding effects.

Figure 3:
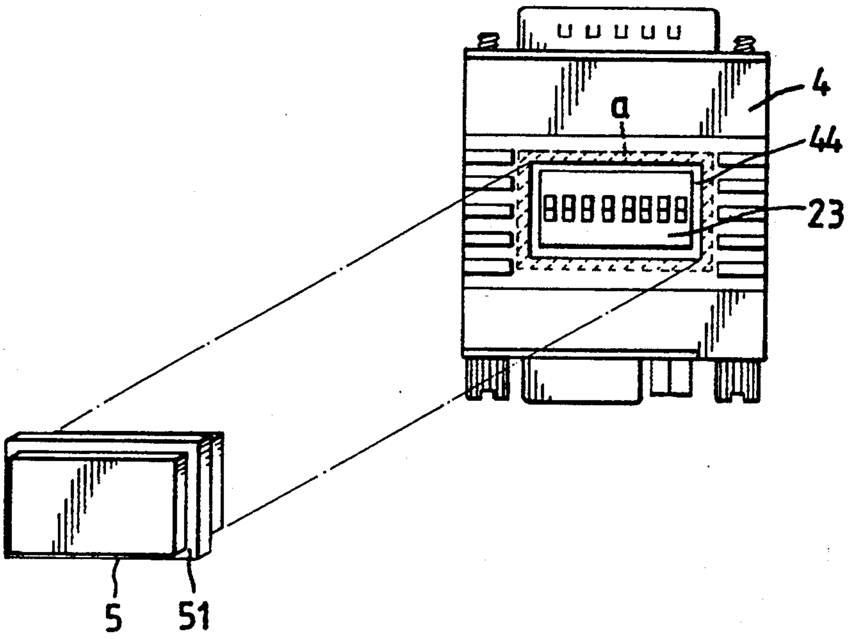
FIG. 3 is a schematic view illustrating the assembly of the first preferred embodiment.

Referring to FIG. 3, because the area of the plate portion 51 of the cover piece 5 is greater than that of the opening 44, an electromagnetic barrier region (a) is formed around the switch unit 23 when the cover piece 5 is mounted in the opening 44, thereby resulting in an enhanced electromagnetic shielding effect.

Figure 4:
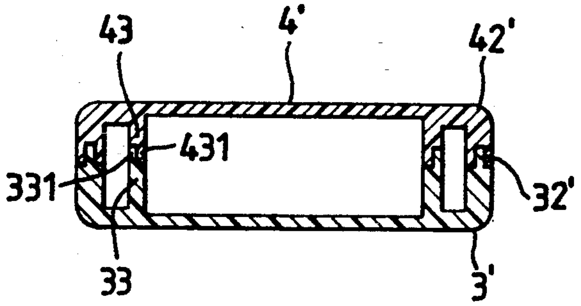
FIG. 4 is a sectional view of an adaptor casing of the second preferred embodiment of an adaptor according to the present invention to illustrate how upper and lower casing halves of the adaptor casing are joined.

FIG. 4 illustrates how upper and lower casing halves 4', 3' of the adaptor casing of the second preferred embodiment of an adaptor according to the present invention are joined. The upper and lower casing halves 4', 3' are further provided with a second pair of side walls 43, 33 which are parallel and adjacent to the first pair of side walls 42', 32'. Each of the side walls 43, 33 has a distal end surface which is formed with a longitudinal projection 431, 331. The projections 331 are disposed posterior with respect to the projection 431 on a corresponding one of the side walls 43 and abut tightly with the same when the lower and upper casing halves 3', 4' are joined The side walls 43, 33 further increase the electromagnetic shielding capability of the present invention.

It should be noted that the connection between the side walls 33, 43 should not be limited to that in the disclosed embodiment. For example, a connection similar to that used in the side walls 32, 42 of the first preferred embodiment may be used to obtain the same result.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An adaptor, comprising:

an adaptor casing including a lower casing half made of plastic and coated entirely with a layer of conductive material, said lower casing half having a bottom wall with two opposite sides provided respectively with at least one side wall, and an upper casing half made of plastic and coated entirely with a layer of conductive material, said upper casing half having a top wall with an opening formed therethrough and two opposite sides provided respectively with at least one side wall that engages a corresponding one of said side walls provided on said bottom wall, thus forming said adaptor casing with front and rear open ends;

a circuit board disposed in said adaptor casing and having a top surface provided with a switch unit that is aligned with said opening and that extends out of said adaptor casing via said opening, a first edge provided with a first connector, and an opposite second edge provided with a second connector, each of said first and second connectors having a support plate which closes a respective one of said front and rear open ends of said adaptor casing, said support plates and said adaptor casing cooperatively forming an enclosure for confining said circuit board therein; and a cover piece made of plastic and coated entirely with a layer of conductive material, said cover piece being fitted detachably in said opening of said upper casing half.

2. The adaptor as claimed in claim 1, wherein said cover piece includes a plate portion which has an area larger than that of said opening.

3. The adaptor as claimed in claim 2, wherein said cover piece further includes a loop projection which projects from said plate portion and which extends fittingly and detachably into said opening.

4. The adaptor as claimed in claim 1, wherein said bottom wall is formed with a screw hole, said top wall being formed with a tubular internally threaded socket that is aligned with and that extends toward said screw hole, said circuit board being formed with a fastener hole that permits extension of said threaded socket therethrough and further having a bottom surface that is provided with a ground point, and said adaptor further comprising:

a conductor having two ends connected respectively to said support plates of said first and second connectors, said conductor being connected electrically to said ground point and having an intermediate portion formed with a connecting ring, said connecting ring defining a hole which is aligned with said fastener hole and being clamped between one end of said threaded socket and said bottom wall; and a conductive screw extending through said fastener hole and said hole defined by said connecting ring and engaging threadedly said screw hole and said threaded socket so as to join said lower and upper casing halves.

5. The adaptor as claimed in claim 4, wherein said hole defined by said connecting ring has a diameter which is slightly smaller than that of said conductive screw.

* * * * *